United States Patent
Takahashi et al.

(10) Patent No.: US 7,038,173 B2
(45) Date of Patent: May 2, 2006

(54) THERMAL PROCESSING APPARATUS AND THERMAL PROCESSING METHOD

(75) Inventors: Mitsukazu Takahashi, Kyoto (JP); Tosiyuki Kobayashi, Kyoto (JP); Toshimitsu Funayoshi, Kyoto (JP)

(73) Assignee: Dainippon Screen Mfg. Co., Ltd., (JP)

( * ) Notice: Subject to any disclaimer, the term of this patent is extended or adjusted under 35 U.S.C. 154(b) by 23 days.

(21) Appl. No.: 10/357,524

(22) Filed: Feb. 3, 2003

(65) Prior Publication Data
US 2003/0146200 A1 Aug. 7, 2003

(30) Foreign Application Priority Data
Feb. 7, 2002 (JP) .............. 2002-030327
Feb. 7, 2002 (JP) .............. 2002-030328

(51) Int. Cl.
*F27B 5/14* (2006.01)
(52) U.S. Cl. ............ 219/390; 219/405; 219/411; 392/416; 392/418; 118/724; 118/725; 118/50.1
(58) Field of Classification Search ............. 219/390, 219/405, 411; 118/724, 725, 50.1; 392/416, 392/418; 374/120–121, 130–131, 126, 128, 374/161
See application file for complete search history.

(56) References Cited

U.S. PATENT DOCUMENTS 4,680,451 A * 7/1987 Gat et al. ............ 219/411
5,951,896 A * 9/1999 Mahawili ............ 219/411
6,437,290 B1 * 8/2002 Shao et al. ............ 219/390
6,570,134 B1 * 5/2003 Suzuki et al. ............ 219/390

FOREIGN PATENT DOCUMENTS

JP 2000182982 6/2000
JP 2001210604 8/2001

OTHER PUBLICATIONS

English translation of Abstract of Japanese Application Laid-Open No. 2001-210604.
English translation of Abstract of Japanese Application Laid-Open No. 2000-182982.

* cited by examiner

*Primary Examiner*—Shawntina Fuqua
(74) *Attorney, Agent, or Firm*—Ostrolenk, Faber, Gerb & Soffen, LLP

(57) ABSTRACT

A thermal processing apparatus, performing processing accompanied with heating on a substrate, having an upper lamp group directed toward a prescribed direction and a lower lamp group perpendicularly intersecting with the upper lamp group is provided with a lower reflector between the upper and lower lamp groups. The lower reflector is so provided as to reflect light from lamps, included in the lower lamp group, present on both end regions in relation to the direction of arrangement. Thus, the thermal processing apparatus can efficiently irradiate an auxiliary ring with reflected light from the lower lamp group and improve temperature uniformity when heating the substrate.

36 Claims, 12 Drawing Sheets

F I G. 5
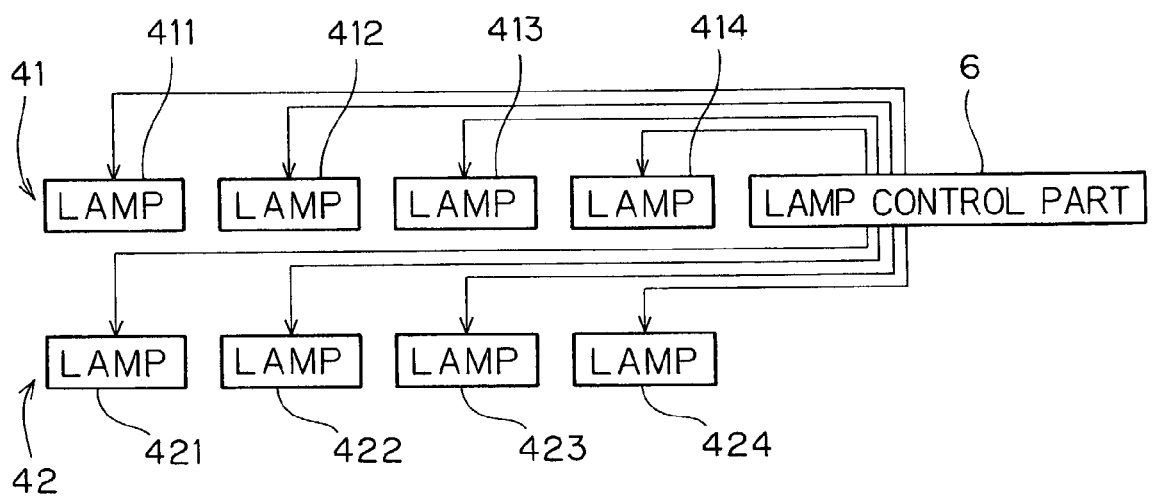
F I G. 6
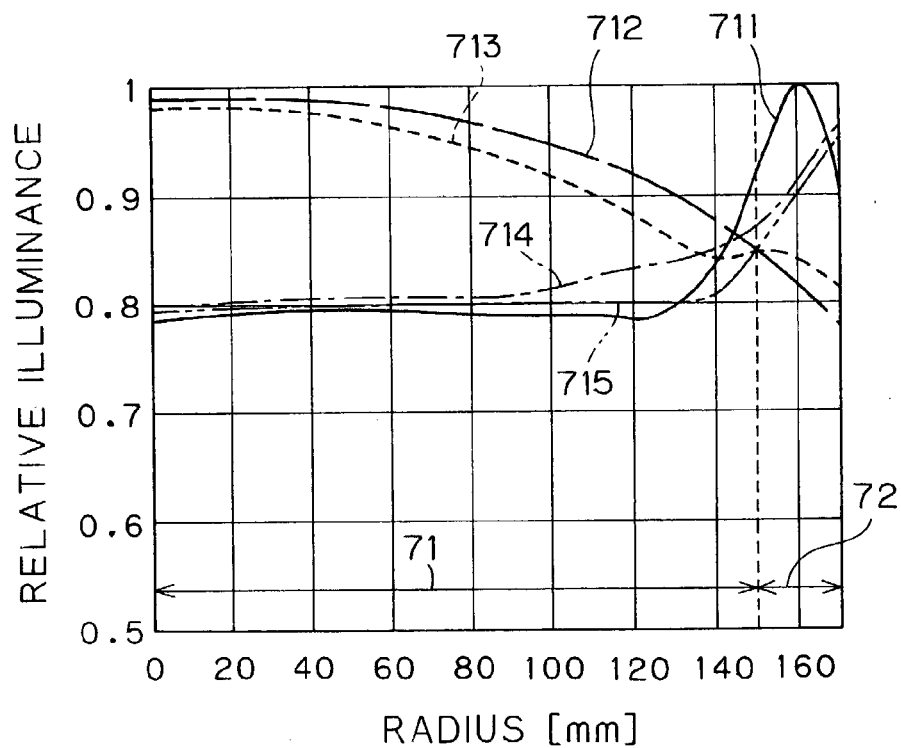

FIG. 17

| LAMP NUMBER | RATED RATIO (%) | | | |
| --- | --- | --- | --- | --- |
| | CONDITION 1 | CONDITION 2 | CONDITION 3 | CONDITION 4 |
| 411 | 100 | 100 | 25 | 35 |
| 412 | 100 | 100 | 10 | 30 |
| 413 | 100 | 100 | 0 | 20 |
| 414 | 100 | 100 | 100 | 100 |
| 421 | 100 | 100 | 20 | 40 |
| 422 | 100 | 100 | 15 | 40 |
| 423 | 100 | 100 | 0 | 60 |
| 424 | 100 | 100 | 100 | 100 |

FIG. 18

| LAMP NUMBER | RATED RATIO (%) | | | |
| --- | --- | --- | --- | --- |
| | CONDITION 1 | CONDITION 2 | CONDITION 3 | CONDITION 4 |
| 411 | 100 | 100 | 25 | 50 |
| 412 | 100 | 100 | 10 | 50 |
| 413 | 100 | 100 | 0 | 70 |
| 414 | 100 | 100 | 100 | 100 |
| 421 | 100 | 100 | 20 | 80 |
| 422 | 100 | 100 | 15 | 80 |
| 423 | 100 | 100 | 0 | 100 |
| 424 | 100 | 100 | 100 | 100 |

THERMAL PROCESSING APPARATUS AND THERMAL PROCESSING METHOD

BACKGROUND OF THE INVENTION

1. Field of the Invention

The present invention relates to a thermal processing apparatus and a thermal processing method performing processing accompanied with heating on a substrate.

2. Description of the Background Art

A rapid thermal process (hereinafter abbreviated as "RTP") plays an important role as one of heating steps for a semiconductor substrate (hereinafter referred to as "substrate") as requirement for refinement of a device such as a semiconductor device is increased. In the RTP, an infrared lamp is mainly employed as a heating source for heating a substrate to a prescribed temperature of 1200° C., for example, at the level of seconds while keeping a prescribed gas atmosphere in a processing chamber and maintaining the substrate at the temperature for a constant time of several 10 seconds, for example, and the lamp is thereafter turned off for rapidly cooling the substrate.

The RTP is employed for performing processing, such as that for preventing an impurity from thermally re-diffusing in junction layers of transistors formed on a substrate or that for reducing the thickness of an insulator film such as an oxide film, for example, which has been hard to implement by prolonged thermal processing in a conventional electric furnace.

A generally known thermal processing apparatus performing the RTP is provided with two stages of parallelly arranged bar lamps. FIGS. 1 and 2 are longitudinal sectional views showing such a type of thermal processing apparatus 8. This thermal processing apparatus 8 has an upper lamp group 81, including bar lamps directed toward an X direction, arranged in a Y direction and a lower lamp group 82, including bar lamps directed toward the Y direction, arranged in the X direction.

A substrate 9 is horizontally arranged to be opposed to the lamp groups 81 and 82, and supported by an auxiliary ring 83 covering the periphery thereof. A window member 84 separating an internal space 80 into two portions is arranged between the lamp groups 81 and 82 and the substrate 9, while the upper surface of the upper lamp group 81 defines a reflector 80a for reflecting light emitted from the upper lamp group 81 and efficiently irradiating the substrate 9 with the light.

The auxiliary ring 83 is integrally heated with the substrate 9 thereby preventing heat dissipation from an end surface of the substrate 9 and maintaining temperature uniformity on the surface of the substrate 9. If the auxiliary ring 83 is insufficiently heated, the temperature on the peripheral edge of the substrate 9 is not increased either. In order to implement temperature uniformity of the substrate 9, therefore, it is important to sufficiently heat the auxiliary ring 83.

In the thermal processing apparatus 8 shown in FIG. 1, the reflector 80a can selectively irradiate a desired region of the substrate 9 with the reflected light from the upper lamp group 81, while no consideration is made as to light upwardly emitted from the lower lamp group 82. Therefore, it follows that the degree of contribution of the reflected light from the reflector 80a to heating of the auxiliary ring 83 is adjusted only through the upper lamp group 81.

In the thermal processing apparatus 8, further, a plurality of concave surfaces uniformly formed on the reflector 80a substantially homogeneously guide the reflected light from the upper lamp group 81 onto the substrate 9 and the auxiliary ring 83. In the case of such a reflector 80a, there is a possibility that the temperature of the auxiliary ring 83 cannot be sufficiently increased.

Thus, it can be said that the structure of the thermal processing apparatus 8 is unpreferable for sufficiently efficiently heating the auxiliary ring 83.

SUMMARY OF THE INVENTION

The present invention is directed to a technique of performing processing accompanied with heating on a substrate.

A substrate processing apparatus according to a preferred embodiment of the present invention, irradiating a substrate with light for performing processing accompanied with heating, comprises a first reflecting surface opposed to the main surface of the substrate to be processed, a first lamp group including bar lamps arranged to be directed toward a prescribed direction along the first reflecting surface respectively, a second lamp group including bar lamps arranged to be directed toward a direction different from the prescribed direction respectively between the first lamp group and the main surface and a second reflecting surface reflecting light received from lamps, included in the second lamp group, present on both end regions in relation to the direction of arrangement between the first lamp group and the second lamp group.

Thus, the thermal processing apparatus can efficiently guide light from the first lamp group to the substrate for improving temperature uniformity of the substrate in heating.

Preferably, the second reflecting surface reflects light received from a lamp, included in lamps of the second lamp group opposed to the outer periphery of the substrate in relation to a direction perpendicular to the main surface, located most outward or a lamp located outward beyond the lamp.

Thus, the second reflecting surface can be suppressed from hindering irradiation of the substrate with the light received from the first lamp group.

The present invention is also directed to a thermal processing apparatus, irradiating a substrate with light for performing processing accompanied with heating, comprising a reflecting surface opposed to the main surface of the substrate to be processed, a lamp group arranged along the reflecting surface and an auxiliary ring outwardly spreading from the outer periphery of the substrate along the outer periphery, whereby the reflecting surface reflects light received from a lamp included in the lamp group and substantially condenses the light on the auxiliary ring.

Therefore, the thermal processing apparatus so efficiently heats the auxiliary ring that temperature uniformity of the substrate is improved in heating.

Accordingly, an object of the present invention is to improve temperature uniformity of a substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a block diagram showing lamps and a lamp control part;

FIG. 6 illustrates the relation between distances from the centers of substrates and relative illuminance;

FIG. 17 illustrates the ratio (rated ratio) of power supplied to each lamp in the first preferred embodiment to rated power; and FIG. 18 illustrates the ratio (rated ratio) of power supplied to each lamp in the second preferred embodiment to rated power.

DESCRIPTION OF THE PREFERRED EMBODIMENTS

Figure 3:
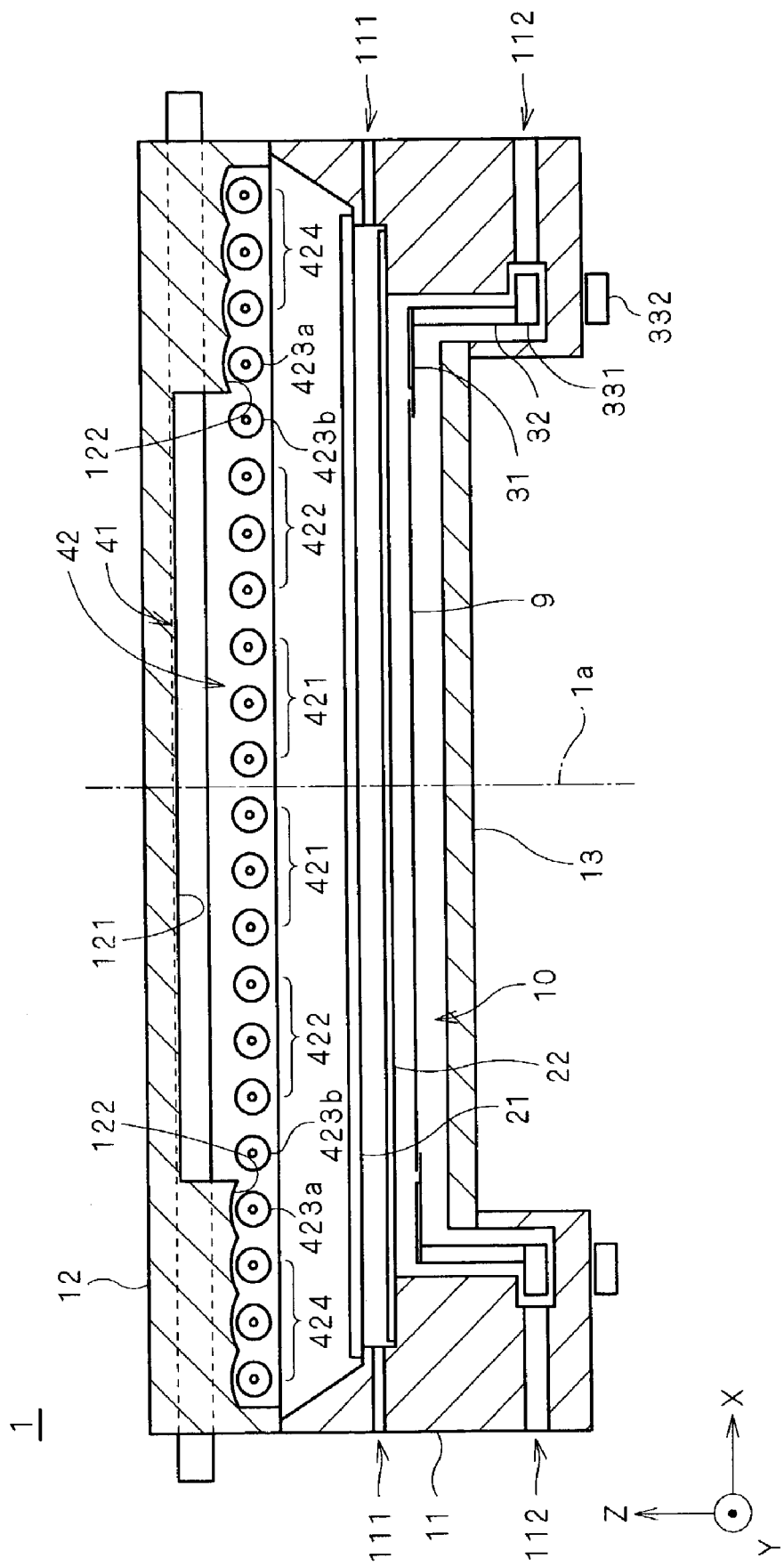
FIGS. 3 and 4 are longitudinal sectional views of a thermal processing apparatus according to a first preferred embodiment of the present invention.
Figure 4:
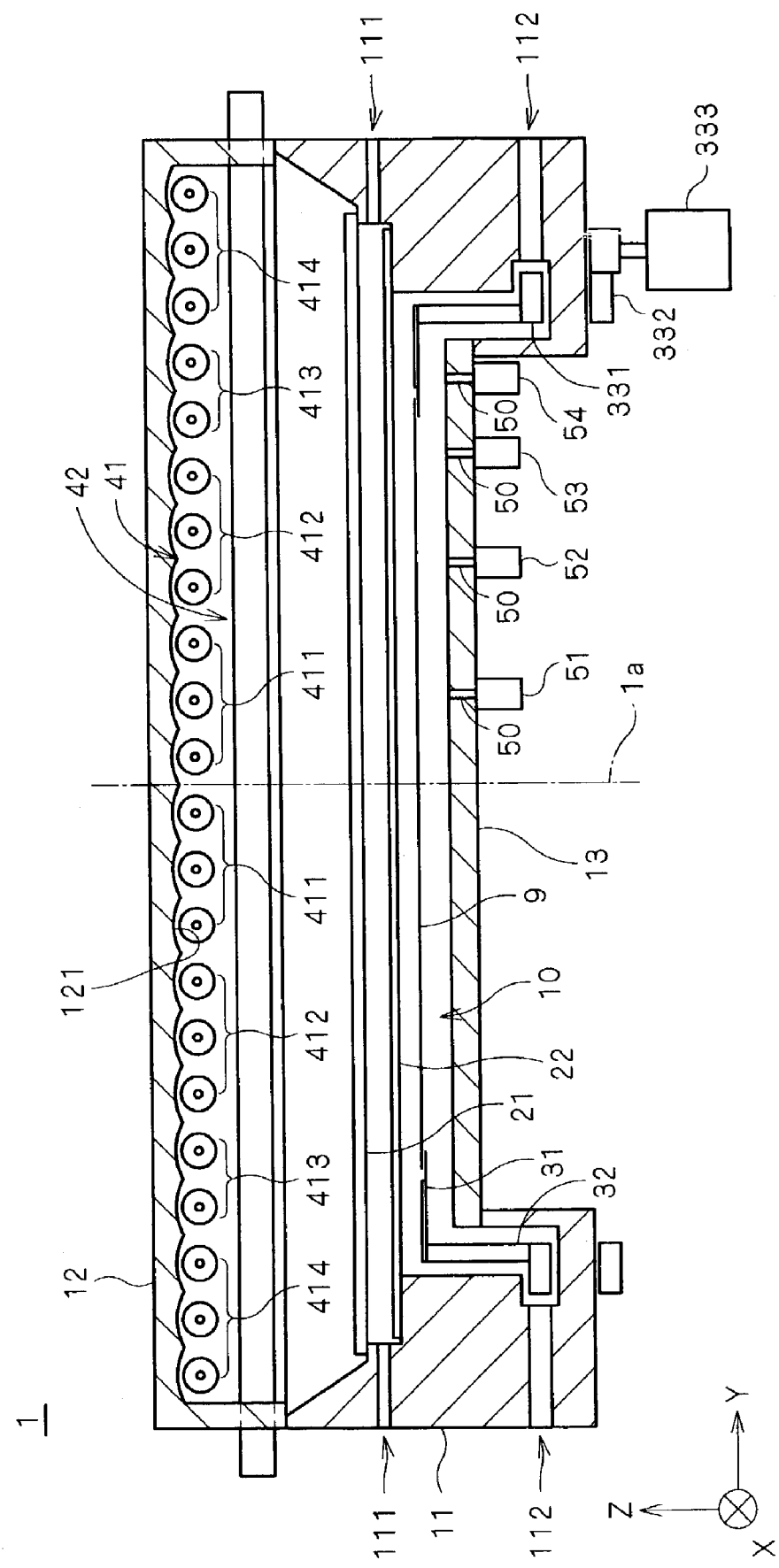

FIGS. 3 and 4 are longitudinal sectional views showing the structure of a thermal processing apparatus 1 according to a first preferred embodiment of the present invention, and the cutting planes in FIGS. 3 and 4 perpendicularly intersect with each other at a central axis 1a of the thermal processing apparatus 1 directed toward a Z direction. FIGS. 3 and 4 omit illustration of parallel oblique lines with respect to sections of details.

The thermal processing apparatus 1 has a body part 11 forming the apparatus body, a lid part 12 covering the upper portion of the body part 11 and a reflector 13 arranged on the central bottom surface of the body part 11, which define an internal space of the thermal processing apparatus 1 together. A chamber window 21 of quartz divides the internal space into an upper space and a lower processing space 10, so that a substrate 9 is arranged in the lower processing space 10. An O-ring (not shown) seals the clearance between the chamber window 21 and the body part 11. The body part 11 has a cylindrical inner side surface.

An external transport mechanism transports the substrate 9 into the processing space 10 and places the same on an auxiliary ring 31. The auxiliary ring 31, formed by a ring outwardly spreading from the outer periphery of the substrate 9 along the outer periphery (about the central axis 1a), comes into contact with the lower peripheral edge of the substrate 9 for supporting the substrate 9. The auxiliary ring 31, made of silicon carbide (SiC), for example, is integrally heated with the substrate 9. Thus, heat dissipation from the peripheral edge of the substrate 9 is suppressed as compared with a case of heating only the substrate 9, so that temperature uniformity of the substrate 9 is improved.

A cylindrical support ring 32 centered by the central axis 1a supports the auxiliary ring 31, and a coupling member 331 is mounted on the lower end of the support ring 32. Another coupling member 332 is provided under the lower potion of the body part 11 to be opposed to the coupling member 331, for forming a magnetic coupling mechanism with the coupling member 331. A motor 333 shown in FIG. 4 rotates the coupling member 332 about the central axis 1a. Thus, the coupling member 331 provided in the body part 11 is rotated due to magnetic action, for rotating the substrate 9 and the auxiliary ring 31 about the central axis 1a.

A plurality of gas inlet ports 111 and outlet ports 112 are formed on the side wall of the body part 11 for (forcibly) discharging gas from the processing space 10 through the outlet ports 112 and introducing gas (e.g., nitrogen and oxygen) responsive to the type of processing performed on the substrate 9 through the gas inlet ports 111, thereby replacing the gas in the processing space 10. A shower plate 22 of quartz formed with a large number of holes is provided between the substrate 9 and the auxiliary ring 31 and the chamber window 21 for homogeneously supplying the gas introduced through the gas inlet ports 111 to the upper surface of the substrate 9 through the shower plate 22. The gas employed for the processing is guided from under the support ring 32 to the outlet ports 112.

The lower surface of the lid part 12 defines a reflecting surface (hereinafter referred to as "upper reflector") 121 opposed to the main surface, i.e., the upper surface of the substrate 9, and an upper lamp group 41 is so arranged that bar lamps included therein are directed toward an X direction in FIGS. 3 and 4 along the upper reflector 121 respectively. The upper reflector 121 reflects light upwardly emitted from the upper lamp group 41 and irradiates the substrate 9 with the same.

The section of the upper reflector 121 perpendicular to an X direction (longitudinal direction of the lamps) has a constant shape formed by arranging parts of parabolas or ellipses locating the lamps on the focal points thereof. Thus, the upper reflector 121 selectively irradiates specific regions of the substrate 9 and the auxiliary ring 31 with most part of reflected light from the lamps of the upper lamp group 41.

A lower lamp group 42 is arranged under the upper lamp group 41, i.e., between the upper lamp group 41 and the main surface of the substrate 9, so that bar lamps included therein are directed toward a Y direction. In other words, the upper and lower lamp groups 41 and 42 are mounted on the lid part 12 orthogonally to each other.

Each of the upper and lower lamp groups 41 and 42 is divided into small blocks in response to distances from the central axis 1a. FIG. 4 illustrates blocks of lamps 411, 412, 413 and 414 of the upper lamp group 41 successively from the central axis 1a, and FIG. 3 illustrates blocks of lamps 421, 422, 423 (pairs of lamps 423a and 423b) and 424 of the lower lamp group 42 successively from the central axis 1a.

FIG. 5 is a block diagram showing the connectional relation between the blocks of lamps 411, 412, 413, 414, 421, 422, 423 and 424 and a lamp control part 6 supplying power to the blocks of lamps 411, 412, 413, 414, 421, 422, 423 and 424. As shown in FIG. 5, the blocks of lamps 411, 412, 413, 414, 421, 422, 423 and 424 are individually connected to the lamp control part 6 and supplied with power independently of each other. Thus, intensity distribution of light applied to the upper surface of the substrate 9 is controlled.

In the thermal processing apparatus 1, two lower reflectors 122 are provided on the lid part 12 for reflecting light from lamps, included in the lower lamp group 42, present on both end regions in relation to the direction of arrangement (X direction) between the upper and lower lamp groups 41 and 42, as shown in FIG. 3. The section of each of the lower reflectors 122 perpendicular to the Y direction (longitudinal direction of the lamps) has a constant shape formed by arranging parts of parabolas or ellipses locating the lamps on the focal points thereof. Thus, the lower reflectors 122 selectively irradiate specific regions of the substrate 9 and the auxiliary ring 31 with most part of reflected light from the lamps, included in the lower lamp group 42, present on both end regions in relation to the direction of arrangement.

Figure 1:
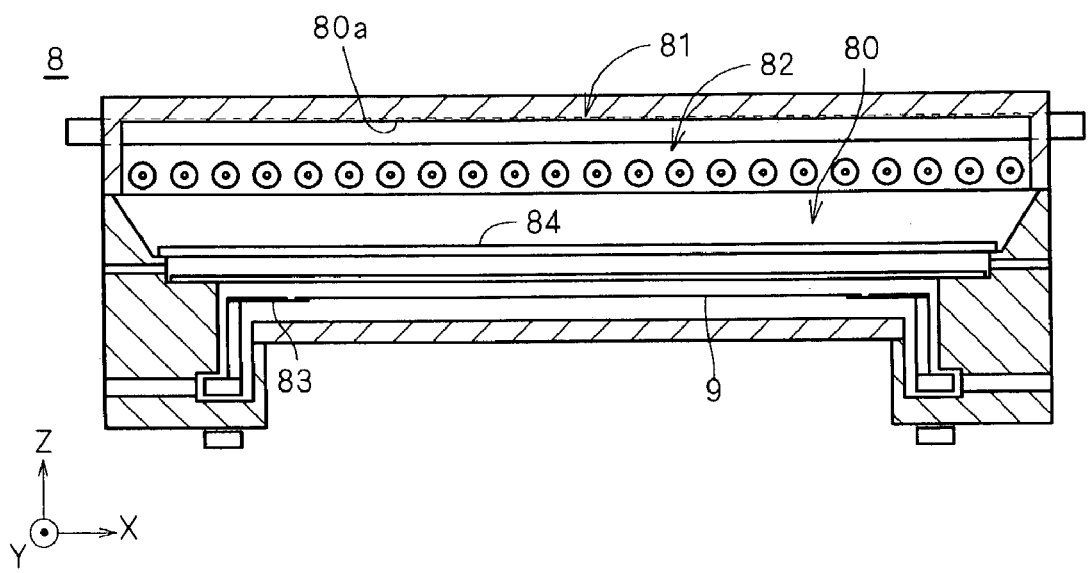
FIGS. 1 and 2 are longitudinal sectional views of a conventional thermal processing apparatus.

The lower reflectors 122 are so provided as to improve heating efficiency for the auxiliary ring 31 as compared with the conventional thermal processing apparatus 8 illustrated in FIG. 1. In the conventional thermal processing apparatus 8, upward light included in the light emitted from the lower lamp group 82 is scattered before reaching the reflector 80a located above the upper lamp group 81. Further, the longitudinal direction of the lamps forming the lower lamp group 82 and the extensional direction of concave surfaces of the reflector 80a (the reflector 80a is formed with the concave surfaces similarly to the upper reflector 121 shown in FIG. 4) are orthogonal to each other and hence it follows that reflected light is further scattered.

In the thermal processing apparatus 1 according to the present invention, on the other hand, the lower reflectors 122 immediately reflect light upwardly emitted from the lamps located under the same, to contribute to heating of the auxiliary ring 31. In particular, reflected light from the lamps 423a (FIG. 3) located immediately above the auxiliary ring 31 is intensively applied to the auxiliary ring 31 thereby implementing efficient heating of the auxiliary ring 31. Reflected light from the lamps 423 located outward beyond the lamps 423a can also be supplied with directivity due to the concave surfaces of the lower reflectors 122, for readily contributing to heating of the auxiliary ring 31.

As shown in FIG. 4, a plurality of radiation thermometers 51 to 54 are mounted on the lower surface of the reflector 13 outwardly from the central axis 1a. The radiation thermometers 51 to 53 receive infrared light from the substrate 9 through a window member 50 thereby measuring the temperature of the substrate 9. The radiation thermometer 54 receives infrared light from the auxiliary ring 31 through a window member 50 thereby measuring the temperature of the auxiliary ring 31. The substrate 9 and the auxiliary ring 31 are rotated and hence the plurality of radiation thermometers 51 to 54 measure the temperatures thereof in response to distances from the central axis 1a.

When performing processing accompanied with heating on the substrate 9, the lamp control part 6 controls power supply to the lamps 411 and 421 in response to a result of measurement of the radiation thermometer 51, and controls power supply to the lamps 412 and 422 the lamps 413 and 423 and the lamps 414 and 424 in response to results of measurement of the radiation thermometers 52, 53 and 54 respectively, for example. At this time, a rotation mechanism formed by the motor 333 and the coupling mechanism rotates the substrate 9 and the auxiliary ring 31 while opposing the same to the upper and lower reflectors 121 and 122. Thus, the lamp control part 6 controls heating of the substrate 9 and the auxiliary ring 31 so that the temperature of the substrate 9 is as homogeneous as possible.

Figure 7:
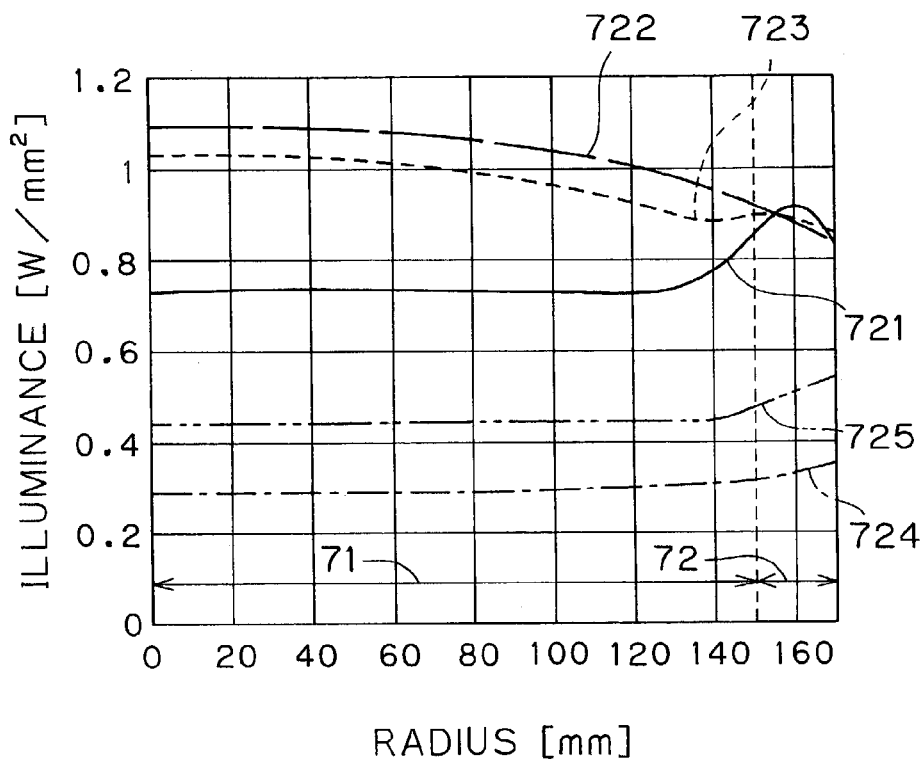
FIG. 7 illustrates the relation between distances from the centers of the substrates and illuminance.

FIG. 6 illustrates the relation between distances (radii) from the centers of the substrates 9 and the auxiliary rings 31 at the distances in a conventional thermal processing apparatus having no lower reflectors 122 and the thermal processing apparatus 1 having the lower reflectors 122. FIG. 7 illustrates the relation between the distances from the centers of the substrates 9 and illuminance on the substrates 9 and the auxiliary rings 31 at the distances in the conventional thermal processing apparatus having no lower reflectors 122 and the thermal processing apparatus 1 having the lower reflectors 122.

FIGS. 6 and 7 show ranges 71 and 72 provided with the substrates 9 and the auxiliary rings 31 respectively. Relative illuminance distribution is referred to as an index for implementing temperature uniformity of the substrate 9 and improving the yield of semiconductor chips, and illuminance distribution is referred to as an index of ability of the thermal processing apparatus 1 for increasing the temperature of the substrate 9.

Curves appearing in FIGS. 6 and 7 show results obtained by simulation on the premise that the substrates 9 and the auxiliary rings 31 are rotated, i.e., average relative illuminance and average illuminance with respect to the distances from the centers of the substrates 9, and the two thermal processing apparatuses compared with each other are similar to each other except presence/absence of the lower reflectors 122 and the lengths (hereinafter referred to as "emission lengths") of emissive portions in the bar lamps. Portions of the conventional thermal processing apparatus are hereafter also denoted by the reference numerals shown in FIGS. 3 and 4.

As to specific conditions for the simulation on each thermal processing apparatus, the diameter of the substrate 9 is 300 mm, the auxiliary ring 31 is doughnut-shaped and has a width of 20 mm, and a lamp interval in the upper and lower lamp groups 41 and 42 is 20 mm.

In the thermal processing apparatus having no lower reflectors 122, the lamps 411 to 413 of the upper lamp group 41 have outputs of 4000 W and emission lengths of 320 mm. In the thermal processing apparatus 1 having the lower reflectors 122, the lamps 411 to 413 have outputs of 3500 W and emission lengths of 280 mm. The outputs of the lamps 411 to 413 per unit length in emission regions are equalized regardless of presence/absence of the lower reflectors 122.

The lamps 421 to 423 of the lower lamp group 42 of each thermal processing apparatus have outputs of 4000 W and emission lengths of 320 mm. The lamps 414 and 424 of the upper and lower lamp groups 41 and 42 mainly heating the auxiliary ring 31 have outputs of 4200 W and emission lengths of 200 mm. The outer lamps 414 and 424 have shorter emission lengths than the remaining lamps 411 to 413 and 421 to 423, and hence the substrate 9 is efficiently irradiated with light from the lamp groups 41 and 42 vertically arranged in a latticelike manner also when the substrate 9 is circular.

Referring to FIGS. 6 and 7, solid curves 711 and 721 show ideal relative illuminance distribution and ideal illuminance distribution respectively. Various light irradiation conditions enabling ideal heating are previously obtained by an experiment, and the curves 711 and 721 show current relative illuminance distribution and current illuminance distribution obtained by illuminance simulation according to the Monte-Carlo method.

Long broken curves 712 and 722 show relative illuminance distribution and illuminance distribution in a case of lighting all lamps 411 to 414 and 421 to 424 in a rated manner (hereinafter referred to as "condition 1") in the thermal processing apparatus having no lower reflectors 122, and short broken curves 713 and 723 show relative illuminance distribution and illuminance distribution in a case of lighting all lamps 411 to 414 and 421 to 424 in a rated manner (hereinafter referred to as "condition 2") in the thermal processing apparatus 1 having the lower reflectors 122.

One-dot chain curves 714 and 724 show relative illuminance distribution and illuminance distribution in a case of lighting the lamps 411 to 414 and 421 to 424 to approach ideal relative illuminance distribution (hereinafter referred to as "condition 3") in the thermal processing apparatus having no lower reflectors 122, and two-dot chain curves 715 and 725 show relative illuminance distribution and illuminance distribution in a case of lighting the lamps 411 to 414 and 421 to 424 to approach ideal relative illuminance distribution (hereinafter referred to as "condition 4") in the thermal processing apparatus 1 having the lower reflectors 122. In the curves 714, 715, 724 and 725, peaks are located outside the auxiliary rings 31.

FIG. 17 shows ratios (rated ratios) of power supplied to the lamps 411 to 414 and 421 to 424 to rated power under the conditions 1 to 4.

Comparing the curves 712 and 713 (conditions 1 and 2) with each other in FIG. 6, it is understood that relative illuminance is outwardly lowered in the auxiliary ring 31 on the curve 712 while reduction of relative illuminance is suppressed on the curve 713. In other words, heating ability for the auxiliary ring 31 is improved when all lamps 411 to 414 and 421 to 424 are lighted with rated power due to provision of the lower reflectors 122.

According to FIG. 17, the rated ratio of the lamps 411 to 413 and 421 to 423 opposed to the substrate 9 substantially reaches 0 to 25% when power is distributed to the blocks of lamps 411 to 414 and 421 to 424 to approach ideal relative illuminance distribution in the thermal processing apparatus having no lower reflectors 122 (condition 3), while the rated ratio of the lamps 411 to 413 and 421 to 423 can be set to 20 to 60% in the thermal processing apparatus 1 having the lower reflectors 122 (condition 4). Under the conditions 3 and 4, the rated ratios of the lamps 414 and 424 substantially opposed to the auxiliary rings 31 are assumed to be 100%.

As shown in the curve 724 (condition 3) in FIG. 7, illuminance for the substrate 9 is reduced to about 40% of ideal illuminance (curve 721) when approaching the relative illuminance distribution to an ideal state in the thermal processing apparatus having no lower reflectors 122. In this case, therefore, it is impossible to properly heat the substrate 9. In the thermal processing apparatus 1 having the lower reflectors 122, illuminance for the substrate 9 is remarkably improved to about 65% of the ideal illuminance as shown in the curve 725 (condition 4). Consequently, the RTP for the substrate 9 can be implemented without reducing the yield.

When the rated ratios of power supplied to the plurality of lamps 411 to 414 and 421 to 424 are remarkably different from each other under the condition 3 for the thermal processing apparatus having no lower reflectors 122, speeds of response or color temperatures or the lives of the lamps 411 to 414 and 421 to 424 disadvantageously differ from each other. Such a problem can be prevented by providing the lower reflectors 122.

As hereinabove described, the thermal processing apparatus 1 provided with the lower reflectors 122 can obtain proper relative illuminance distribution and proper illuminance distribution on the substrate 9 and prevent the lamps 411 to 414 and 421 to 424 from difference in lit state.

The region provided with the lower reflectors 122 is now described. As hereinabove described, the lower reflectors 122 are provided mainly for irradiating the auxiliary ring 31 with reflected light. On the other hand, the emission length of the upper lamp group 41 must be reduced due to the presence of the lower reflectors 122. Therefore, the lower reflectors 122 are preferably present substantially outside above the region provided with the auxiliary ring 31 in the section shown in FIG. 3.

Figure 8:
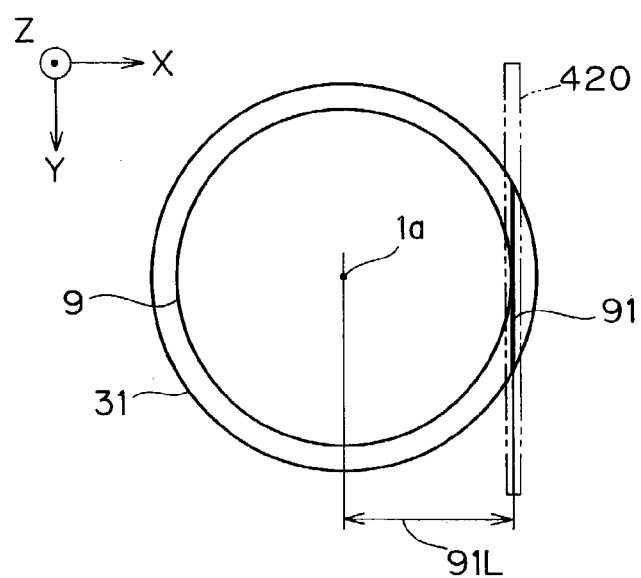
FIG. 8 illustrates a region where a substrate and an auxiliary ring are irradiated with reflected light from a lamp.

Assuming that the lamps 411 to 414 and 421 to 424 are bar-shaped and the reflected light is guided substantially immediately downward, it follows that light reflected by the lower reflectors 122 is applied to a linear region. FIG. 8 illustrates a region 91 where the substrate 9 and the auxiliary ring 31 are irradiated with reflected light from a single lamp 420 present under either lower reflector 122 with a wide line. Assuming that the lamp 420 is present immediately above the outer periphery of the substrate 9 in relation to the X direction as shown in FIG. 8, light emitted from an end of the lamp 420 and reflected is guided to outside the auxiliary ring 31. Due to rotation of the substrate 9 and the auxiliary ring 31, it follows that reflected light from the lamp 420 is applied to an arbitrary region of the auxiliary ring 31.

Considering the relation between distances from the central axis 1a and average irradiation energy (i.e., values obtained by dividing irradiation energy to concentric regions by areas) at the distances, the average irradiation energy is maximized at a distance slightly longer than the distance 91L between the central axis 1a and the center of the region 91. Also when the lower reflectors 122 spread toward the central axis 1a for slightly irradiating the substrate 9 with reflected light, it follows that light from the lower reflectors 122 is substantially applied to the auxiliary ring 31.

In other words, the lower reflectors 122, provided for irradiating the auxiliary ring 31 with reflected light, may not be so designed as not to completely irradiate the substrate 9 with the reflected light. When reflected light from the lower reflectors 122 is substantially guided immediately downward, the lower reflectors 122 may generally be so designed as to reflect light from the lamps 423b located most outward among the lamps 421, 422 and 423b in FIG. 3, included in the lower lamp group 42, opposed to the outer periphery of the substrate 9 in relation to the direction perpendicular to the main surface of the substrate 9. The lower reflectors 122 may alternatively be provided to reflect light from the lamps 423a and 424 located outward beyond the lamps 423b as illustrated in FIG. 3, as a matter of course. Thus, temperature uniformity of the substrate 9 can be implemented while inhibiting the lower reflectors 122 from hindering irradiation with light from the upper lamp group 41.

According to the present invention, the thermal processing apparatus 1 can also be employed for heating a material (glass substrate or the like) other than a semiconductor substrate, for example.

The lamps 411 to 414 and 421 to 424 of the upper and lower lamp groups 41 and 42 may not be orthogonal to each other but may intersect with each other at a prescribed angle. Further, the auxiliary ring 31 may alternatively be formed by a plurality of members so far as the same encloses the outer periphery of the substrate 9.

While the first preferred embodiment has been described with reference to the thermal processing apparatus 1 having the auxiliary ring 31, the lower reflectors 122 can also be utilized for a thermal processing apparatus having no auxiliary ring 31. In this case, the lower reflectors 122 can efficiently heat the outer periphery of the substrate 9 for improving temperature uniformity of the substrate 9.

In consideration of the fact that the lower reflectors 122 hinder the emission length of the upper lamp group 41, the lower reflectors 122 are preferably so designed as to reflect light from the most outwardly located lamps 423b in the lower lamp group 42 opposed to the outer periphery of the substrate 9 in relation to the direction perpendicular to the main surface of the substrate 9 or the lamps 423a and 424 located outward beyond the lamps 423b.

While the thermal processing apparatus 1 rotates the substrate 9, the substrate 9 may be rotated only at need.

The concave surfaces of the upper and lower reflectors 121 and 122 may alternatively have sectional shapes other than parabolic or elliptic shapes. Further, the lower reflectors 122 may alternatively be provided as a single surface (e.g., two reflectors connected with each other on a position separated from the central axis 1a) having two reflecting regions reflecting light from both end regions of the lower lamp group 42.

The substrate 9 may not be horizontally supported, and the overall thermal processing apparatus 1 may be inclined. Further, the overall structure may be vertically inverted so that the lamp groups 41 and 42 are arranged under the lower surface of the substrate 9.

The thermal processing apparatus 1 may individually control lighting of the upper and lower lamp groups 41 and 42 every lamp. When the lamp control part 6 controls power supplied to lamps (may not be all lamps on both ends) present on both end regions in relation to the direction of arrangement of the lower lamp group 42 independently of the lamps present on other regions, the thermal processing apparatus 1 can efficiently heat the auxiliary ring 31 for improving temperature uniformity of the substrate 9.

Figure 9:
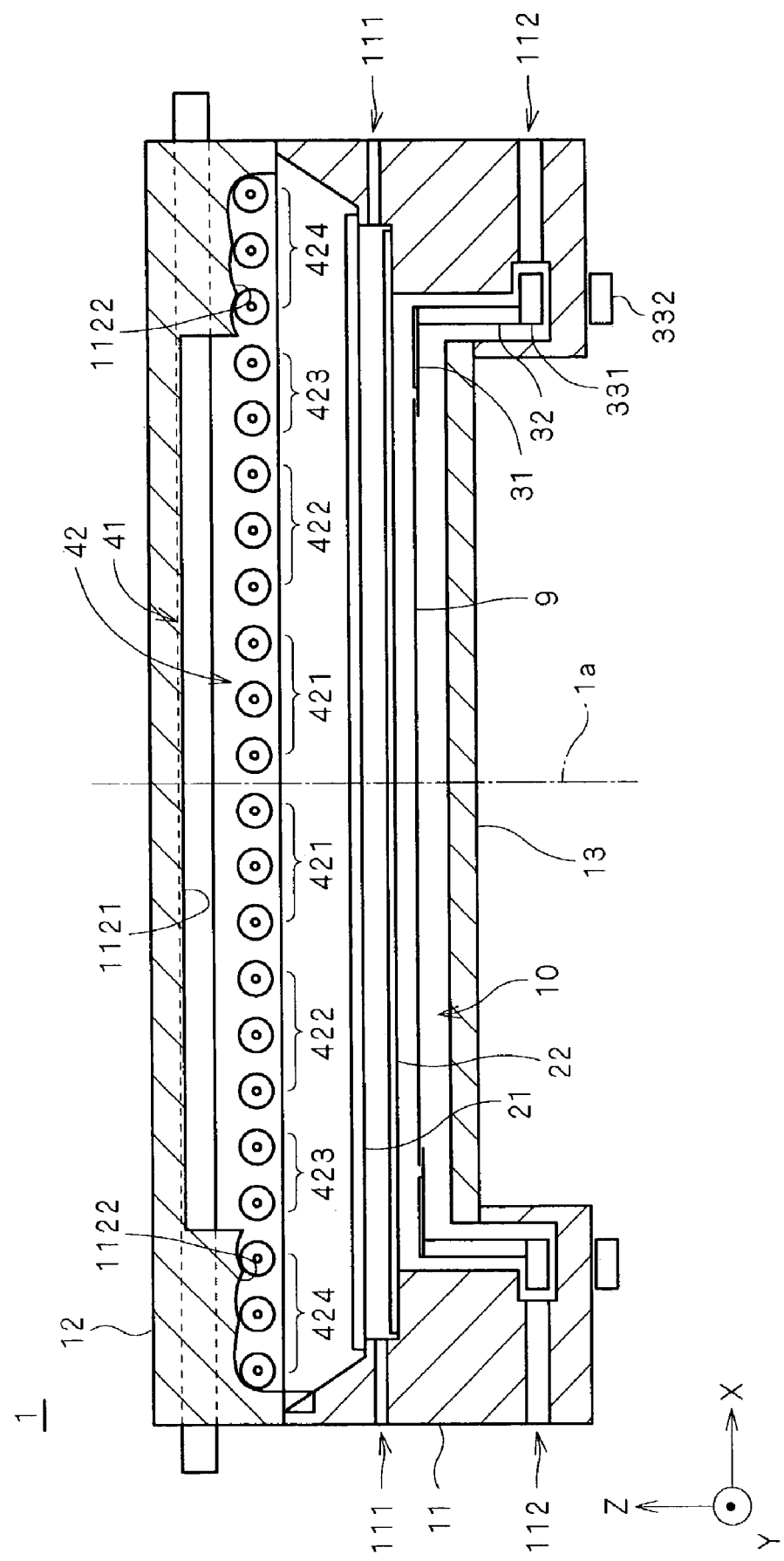
FIGS. 9 and 10 are longitudinal sectional views of a thermal processing apparatus according to a second preferred embodiment of the present invention.
Figure 10:
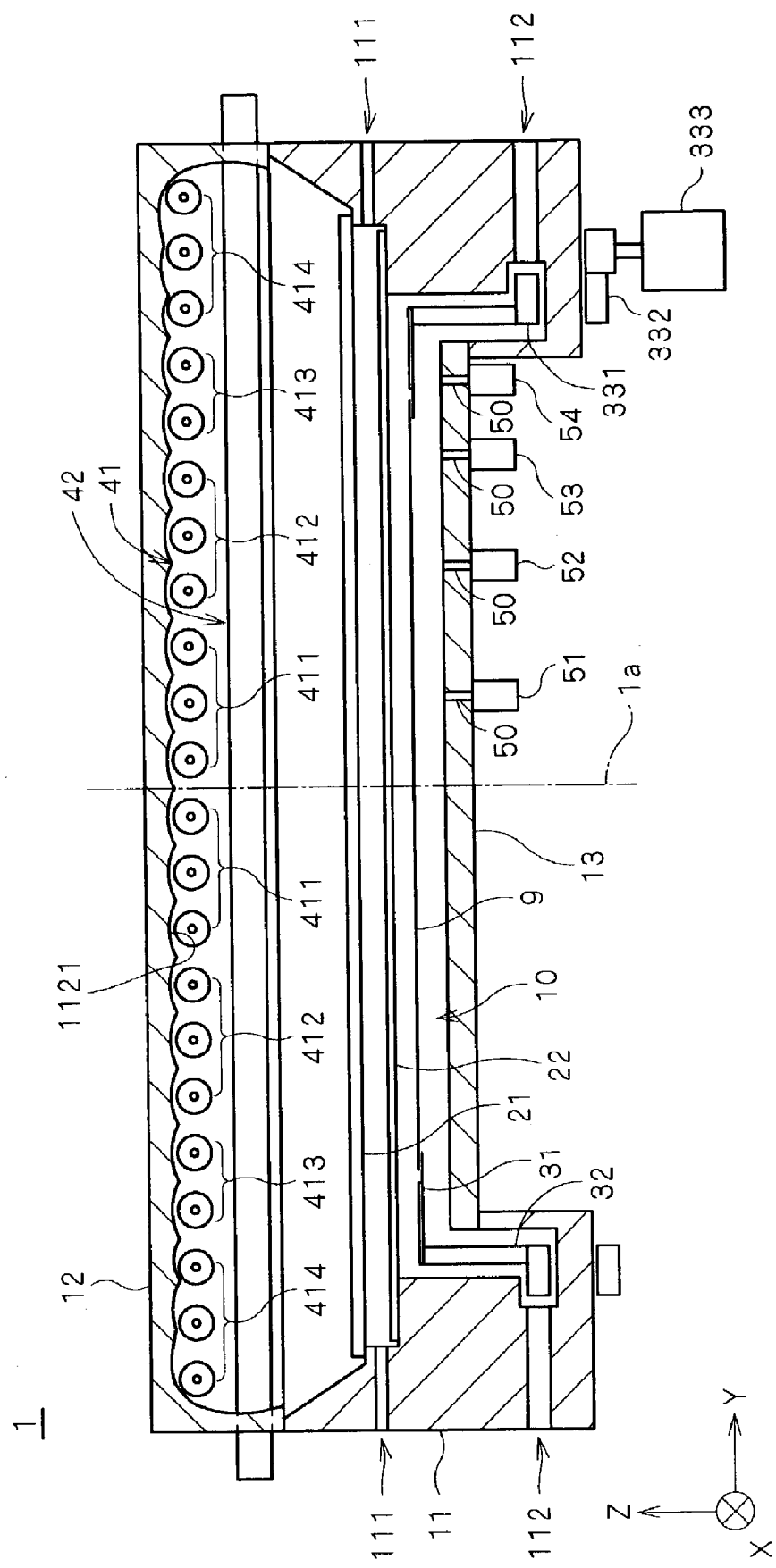

FIGS. 9 and 10 are longitudinal sectional views showing the structure of a thermal processing apparatus 1 according to a second preferred embodiment of the present invention, and the cutting planes in FIGS. 9 and 10 perpendicularly intersect with each other at a central axis 1a of the thermal processing apparatus 1 directed toward a Z direction. FIGS. 9 and 10 omit illustration of parallel oblique lines with respect to sections of details. In the second preferred embodiment, members identical to those of the aforementioned first preferred embodiment are denoted by the same reference numerals, and redundant description is properly omitted.

The lower surface of a lid part 12 in the second preferred embodiment defines a reflecting surface (hereinafter referred to as "upper reflector") 1121 opposed to the main surface of a substrate 9, and an upper lamp group 41 is so arranged that bar lamps forming the same are directed toward an X direction in FIGS. 9 and 10 along the upper reflector 1121. The upper reflector 1121 reflects light upwardly emitted from the upper lamp group 41 and irradiates the substrate 9 with the same.

The section of the upper reflector 1121 perpendicular to an X direction (longitudinal direction of the lamps) has a constant shape formed by arranging parts of ellipses locating the lamps on the focal points thereof. Thus, the upper reflector 1121 selectively irradiates specific regions of the substrate 9 and an auxiliary ring 31 with most part of reflected light from the lamps of the upper lamp group 41.

A lower lamp group 42 is arranged under the upper lamp group 41, i.e., between the upper lamp group 41 and the main surface of the substrate 9, so that bar lamps forming the same are directed toward a Y direction. In other words, the upper and lower lamp groups 41 and 42 are mounted on the lid part 12 orthogonally to each other.

Each of the upper and lower lamp groups 41 and 42 is divided into small blocks in response to distances from the central axis 1a. FIG. 10 illustrates blocks of lamps 411, 412, 413 and 414 of the upper lamp group 41 successively from the central axis 1a, and FIG. 9 illustrates blocks of lamps 421, 422, 423 and 424 of the lower lamp group 42 successively from the central axis 1a.

Figure 11:
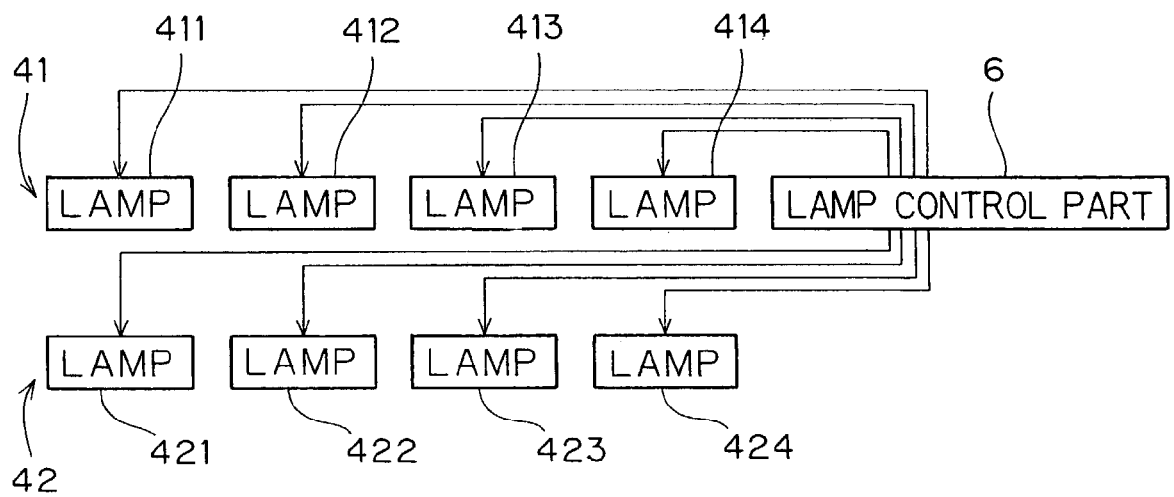
FIG. 11 is a block diagram showing lamps and a lamp control part.

FIG. 11 is a block diagram showing the connectional relation between the blocks of lamps 411, 412, 413, 414, 421, 422, 423 and 424 and a lamp control part 6 supplying power to the blocks of lamps 411, 412, 413, 414, 421, 422, 423 and 424. As shown in FIG. 11, the blocks of lamps 411, 412, 413, 414, 421, 422, 423 and 424 are individually connected to the lamp control part 6 and supplied with power independently of each other. Thus, intensity distribution of light applied to the upper surface of the substrate 9 is controlled.

In the thermal processing apparatus 1, two lower reflectors 1122 are provided on the lid part 12 for reflecting light from the lamps 424, included in the lower lamp group 42, present on both end regions in relation to the direction of arrangement (X direction) between the upper and lower lamp groups 41 and 42, as shown in FIG. 9. The section of each of the lower reflectors 1122 perpendicular to a Y direction (longitudinal direction of the lamps) has a constant shape formed by arranging parts of ellipses locating the lamps on the focal points thereof. Thus, the lower reflectors 1122 selectively irradiate a specific region of the auxiliary ring 31 with most part of reflected light from the lamps 424, included in the lower lamp group 42, present on both end regions in relation to the direction of arrangement.

Figure 2:
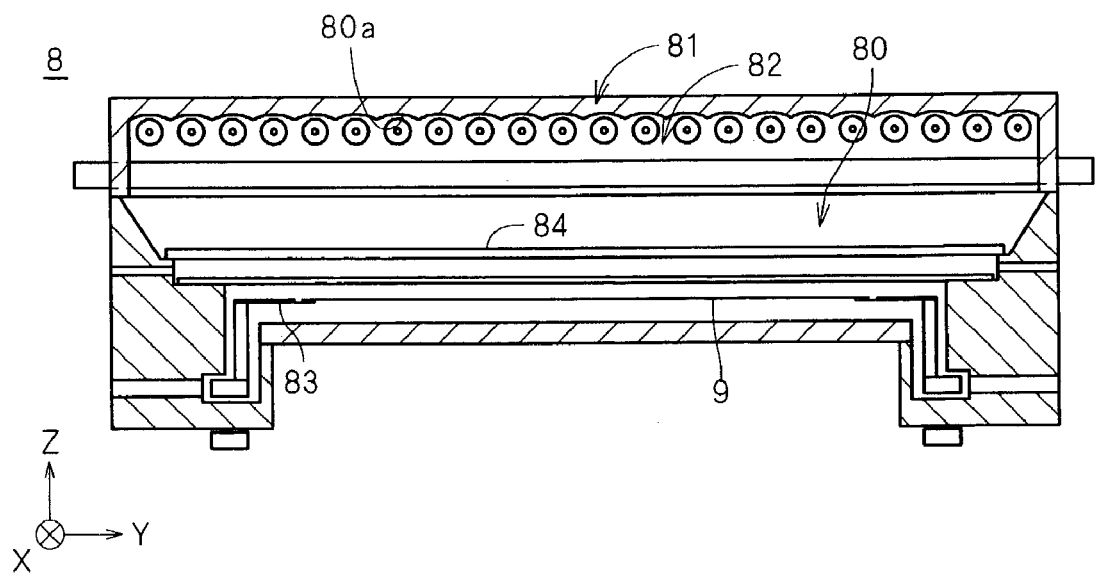

The lower reflectors 1122 are so provided as to improve heating efficiency for the auxiliary ring 31 as compared with the conventional thermal processing apparatus 8 illustrated in FIGS. 1 and 2. In the conventional thermal processing apparatus 8, upward light included in the light emitted from the lower lamp group 82 is scattered before reaching the reflector 80a located above the upper lamp group 81. Further, the longitudinal direction of the lamps forming the lower lamp group 82 and the extensional direction of the concave surfaces of the reflector 80a (see FIG. 2) are orthogonal to each other and hence it follows that reflected light is further scattered.

In the thermal processing apparatus 1, on the other hand, the lower reflectors 1122 immediately reflect light upwardly emitted from the lamps located under the same, to contribute to heating of the auxiliary ring 31 as described later.

As shown in FIG. 10, a plurality of radiation thermometers 51 to 54 are mounted on the lower surface of a reflector 13 outwardly from the central axis 1a. The radiation thermometers 51 to 53 receive infrared light from the substrate 9 through a window member 50 thereby measuring the temperature of the substrate 9. The radiation thermometer 54 receives infrared light from the auxiliary ring 31 through a window member 50 thereby measuring the temperature of the auxiliary ring 31. The substrate 9 and the auxiliary ring 31 are rotated and hence the plurality of radiation thermometers 51 to 54 measure the temperatures thereof in response to distances from the central axis 1a.

When performing processing accompanied with heating on the substrate 9, the lamp control part 6 controls power supply to the lamps 411 and 421 in response to a result of measurement of the radiation thermometer 51, and controls power supply to the lamps 412 and 422 the lamps 413 and 423 and the lamps 414 and 424 in response to result of measurements of the radiation thermometers 52, 53 and 54 respectively, for example. At this time, a rotation mechanism formed by a motor 333 and a coupling mechanism rotates the substrate 9 and the auxiliary ring 31 while opposing the same to the upper and lower reflectors 1121 and 1122. Thus, the lamp control part 6 controls heating of the substrate 9 and the auxiliary ring 31 so that the temperature of the substrate 9 is as homogeneous as possible.

The shapes of the upper and lower reflectors 1121 and 1122 are now described.

Figure 12:
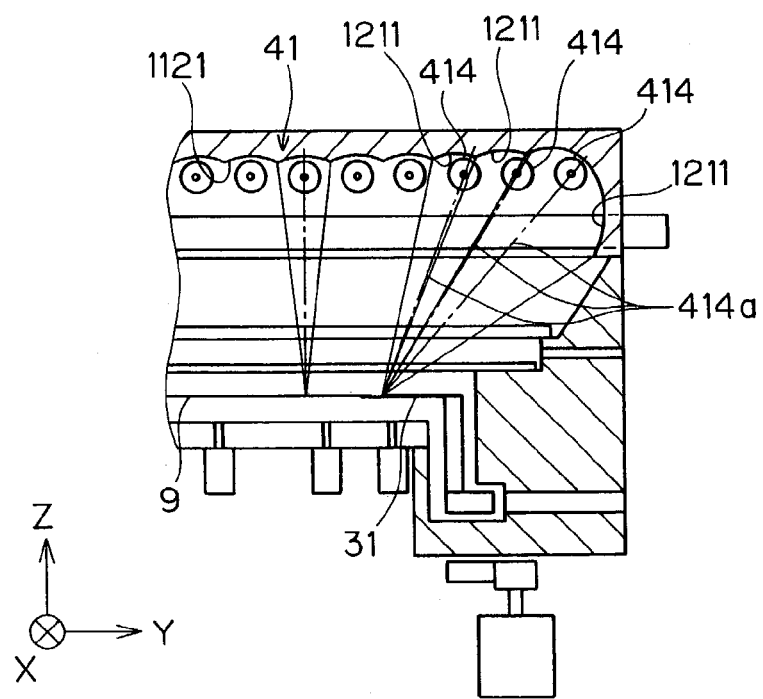
FIGS. 12 and 13 are longitudinal sectional views showing a state of condensing reflected light on an auxiliary ring.

FIG. 12 illustrates the substrate 9 and the auxiliary ring 31 irradiated with light from the upper lamp group 41. The section of the upper reflector 1121 along a Y-Z plane has a shape formed by arranging parts of ellipses locating the centers of the lamps 411 to 414 and the positions to be irradiated on the focal points thereof. Therefore, light from each lamp is linearly condensed on the substrate 9 and the auxiliary ring 31.

Reflected light from the lamps 411 to 413 forming the upper lamp group 41 except the lamps 414 present on both end regions in relation to the direction arrangement is substantially guided immediately downward, and condensed on the substrate 9. On the other hand, concave surfaces 1211 formed for the respective ones of the lamps 414 are formed in the X direction along the lamps 414 while symmetric planes (planes, including symmetry axes 414a of the ellipses, parallel in the X direction) are inclined from a normal direction (Z direction) of the main surface of the substrate 9 toward the substrate 9. The symmetry axes 414a are so inclined as to come into contact substantially with the inner side surface of the auxiliary ring 31 (outer side surface of the substrate 9), for condensing reflected light from the plurality of lamps 414 on the same region.

Figure 13:
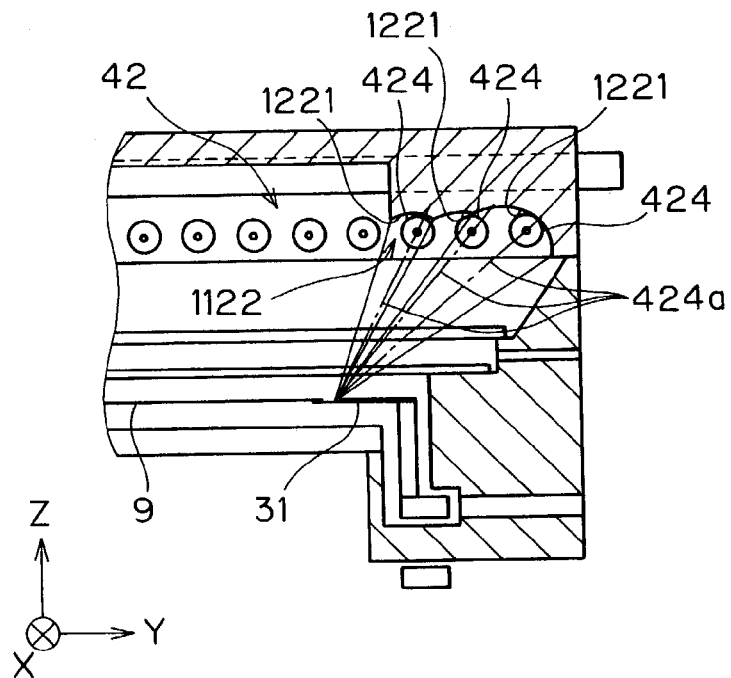

FIG. 13 shows the auxiliary ring 31 irradiated with reflected light from the lamps 424, included in the lower lamp group 42, present on the respective ones of both end regions in relation to the direction of arrangement. The pair of lower reflectors 1122 are also formed with concave surfaces 1221 along the lamps 414 to have sections partially forming ellipses for the respective ones of the lamps 424, and symmetry planes (planes, including symmetry axes 424a of the ellipses, parallel in the Y direction) are inclined from the normal direction (Z direction) of the main surface of the substrate 9 toward the substrate 9. The symmetry axes 424a are so inclined as to come into contact substantially with the inner side surface of the auxiliary ring 31 (outer side surface of the substrate 9), for condensing reflected light from the plurality of lamps 424 on the same region.

The concave surfaces 1211 and 1221 may not intersect with the symmetry planes but the depths thereof can be suppressed by employing concave surfaces not intersecting with the symmetry planes and densely coupling a plurality of concave surfaces with each other. While it is necessary to form a large concave surface having a large depth in a case of condensing light from a single high-output lamp on the auxiliary ring 31 in place of three concave surfaces 1211, for example, the upper reflector 1121 can be readily worked by condensing light from a plurality of lamps by a plurality of shallow concave surfaces coupled with each other. This also applies to the lower reflectors 1122.

As hereinabove described, the thermal processing apparatus 1 condenses reflected light from the upper and lower reflectors 1121 and 1122 on the auxiliary ring 31, whereby the auxiliary ring 31 can be efficiently heated for improving temperature uniformity of the substrate 9. Further, the thermal processing apparatus 1 condenses reflected light from the plurality of lamps 414 and 424 (condenses reflected light from the plurality of lamps 414 and 424 on a single irradiated region of the auxiliary ring 31 in particular), whereby the auxiliary lamp 31 can be rapidly heated to a high temperature also when the power of a single lamp is small.

Figure 14:
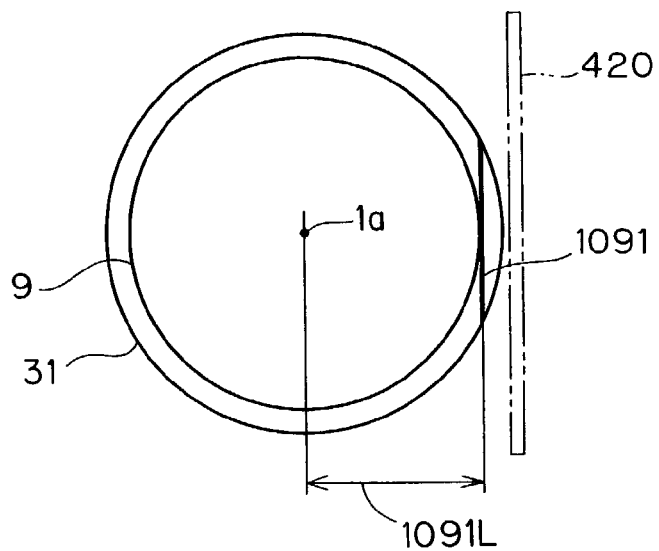
FIG. 14 illustrates a region where a substrate and an auxiliary ring are irradiated with reflected light from a lamp.

The manner of irradiating the auxiliary ring 31 with reflected light is further described. As hereinabove described, each lamp is bar-shaped in the thermal processing apparatus 1 and a single concave surface of each reflector is formed along the lamp, while reflected light corresponding to a single lamp is applied to a linear region. FIG. 14 illustrates a region 1091 where the auxiliary ring 31 is irradiated with reflected light from a lamp 420 corresponding to either each lamp 414 or each lamp 424 with a wide line. As shown in FIG. 14, light emitted from an end of the lamp 420 and reflected is guided to outside the auxiliary ring 31. Due to rotation of the substrate 9 and the auxiliary ring 31, it follows that reflected light from the lamp 42 is applied to an arbitrary region of the auxiliary ring 31.

Considering the relation between distances from the central axis 1a and average irradiation energy (i.e., values obtained by dividing irradiation energy to concentric regions by areas) at the distances, the average irradiation energy is maximized at a distance slightly longer than the distance 1091L between the central axis 1a and the center of the region 1091. Also when the inclination of the symmetry planes of the concave surfaces is so set as to slightly irradiate the substrate 9 with reflected light, therefore, it follows that light from the reflectors is condensed and applied to the auxiliary ring 31.

In other words, the concave surfaces 1211 and 1221 corresponding to the lamps 414 and 424, provided for irradiating the auxiliary ring 31 with reflected light, may not be so designed as not to completely irradiate the substrate 9 with the reflected light.

The thermal processing apparatus 1, having a plurality of lamps on each of both end regions in relation to the direction of arrangement of the lamp groups 41 and 42 for applying light to the same region, can condense reflected light from a large number of lamps on the auxiliary ring 31 for extremely efficiently heating the auxiliary ring 31.

Figure 15:
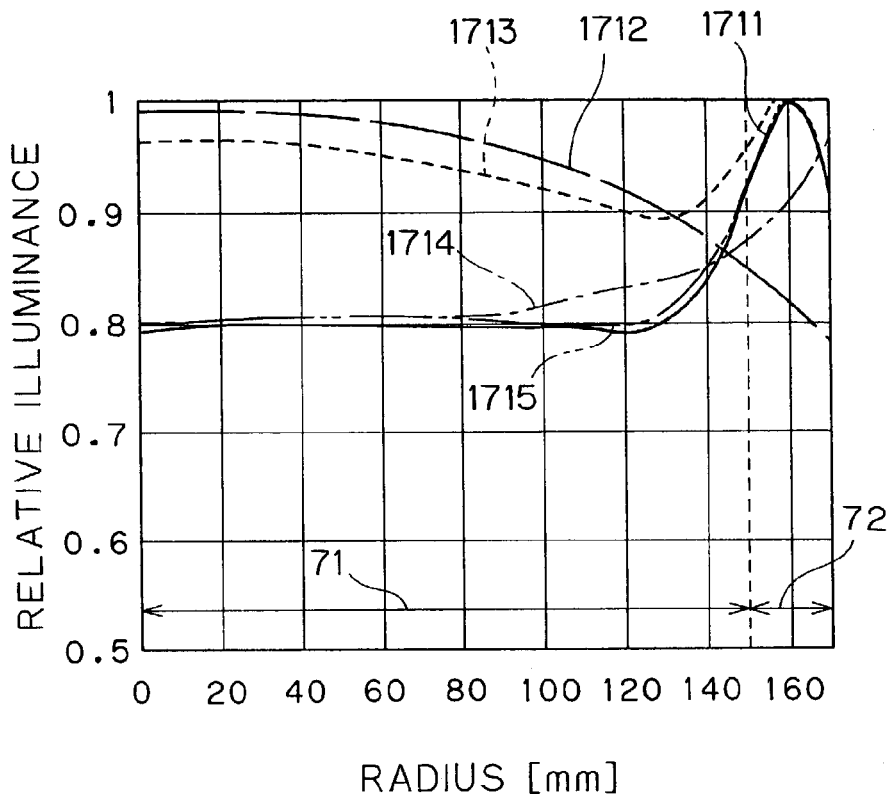
FIG. 15 illustrates the relation between distances from the centers of substrates and relative illuminance.
Figure 16:
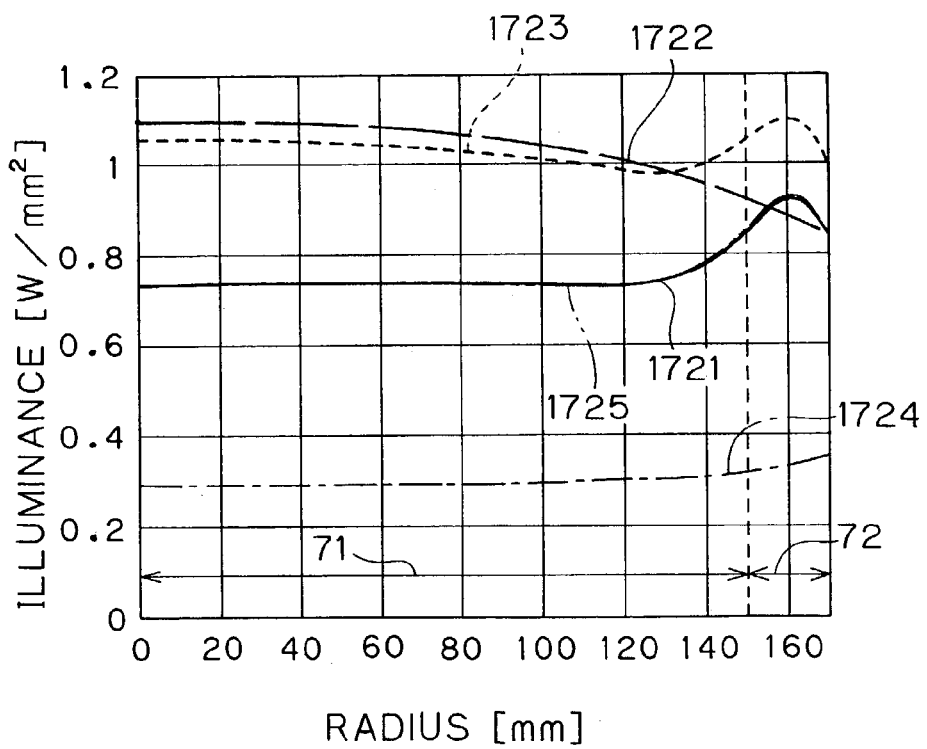
FIG. 16 illustrates the relation between distances from the centers of the substrates and illuminance.

FIG. 15 shows the relation between the distance (radius) from the center of the substrate and relative illuminance on the substrate and the auxiliary ring at the distance in each of the thermal processing apparatus (the conventional thermal processing apparatus) having no lower reflectors 1122 and condensing no reflected light from a (upper) reflector on the auxiliary ring and the thermal processing apparatus 1 having the lower reflectors 1122 and condensing the reflected light from the upper reflector 1121 on the auxiliary ring 31. FIG. 16 shows the relation between the distance from the center of the substrate and illuminance on the substrate and the auxiliary ring at the distance in each of the conventional thermal processing apparatus and the thermal processing apparatus 1 shown in FIGS. 9 and 10.

In each of FIGS. 15 and 16, numerals 71 and 72 denote ranges where the substrate 9 and the auxiliary ring 31 are present respectively. Relative illuminance distribution is referred to as an index for implementing temperature uniformity of the substrate 9 and improving the yield of semiconductor chips, and illuminance distribution is referred to as an index of ability of the thermal processing apparatus 1 for increasing the temperature of the substrate 9.

Curves appearing in FIGS. 15 and 16 show results obtained by simulation on the premise that the substrates 9 and the auxiliary rings 31 are rotated, i.e., average relative illuminance and average illuminance with respect to the distances from the centers of the substrates 9, and the two thermal processing apparatuses compared with each other are similar to each other except presence/absence of the lower reflectors 1122 and the shapes of the reflectors. Portions of the conventional thermal processing apparatus are hereafter also denoted by the reference numerals shown in FIGS. 9 and 10.

As to specific conditions for the simulation of each thermal processing apparatus, the diameter of the substrate 9 is 300 mm, the auxiliary ring 31 is doughnut-shaped and has a width of 20 mm, and a lamp interval in the upper and lower lamp groups 41 and 42 is 20 mm.

The lamps 411 to 413 of the upper lamp group 41 and the lamps 421 to 423 of the lower lamp group 42 have outputs of 4000 W and emission lengths of 320 mm. The lamps 414 and 424 mainly heating the auxiliary ring 31 in the upper and lower lamp groups 41 and 42 have outputs of 4200 W and emission lengths of 200 mm. The outer lamps 414 and 424 have smaller emission lengths than the remaining lamps 411 to 413 and 421 to 423, and hence the substrate 9 is efficiently irradiated with light from the lamp groups 41 and 42 vertically arranged in a latticelike manner also when the substrate 9 is circular.

Referring to FIGS. 15 and 16, solid curves 1711 and 1721 show ideal relative illuminance distribution and ideal illuminance distribution respectively. Various light irradiation conditions enabling ideal heating are previously obtained by an experiment, and the curves 1711 and 1721 show current relative illuminance distribution and current illuminance distribution obtained by illuminance simulation according to the Monte-Carlo method.

Long broken curves 1712 and 1722 show relative illuminance distribution and illuminance distribution in a case of lighting all lamps 411 to 414 and 421 to 424 in a rated manner (hereinafter referred to as "condition 1") in the conventional thermal processing apparatus, and short broken curves 1713 and 1723 show relative illuminance distribution and illuminance distribution in a case of lighting all lamps 411 to 414 and 421 to 424 in a rated manner (hereinafter referred to as "condition 2") in the thermal processing apparatus 1 according to the second preferred embodiment.

One-dot chain curves 1714 and 1724 show relative illuminance distribution and illuminance distribution in a case of lighting the lamps 411 to 414 and 421 to 424 to approach ideal relative illuminance distribution (hereinafter referred to as "condition 3") in the conventional thermal processing apparatus, and two-dot chain curves 1715 and 1725 show relative illuminance distribution and illuminance distribution in a case of lighting the lamps 411 to 414 and 421 to 424 to approach ideal relative illuminance distribution (hereinafter referred to as "condition 4") in the thermal processing apparatus 1 according to the second preferred embodiment. In the curves 1714 and 1724, peaks are located outside the auxiliary rings 31.

FIG. 18 shows ratios (rated ratios) of power supplied to the lamps 411 to 414 and 421 to 424 to rated power under the conditions 1 to 4.

Comparing the curves 1712 and 1713 (conditions 1 and 2) with each other in FIG. 15, it is understood that relative illuminance is outwardly lowered in the auxiliary ring 31 on the curve 1712 while relative illuminance is increased on the auxiliary ring 31 on the curve 1713. In other words, heating ability for the auxiliary ring 31 upon lighting of all lamps 411 to 414 and 421 to 424 at rated power is improved when the lower reflectors 1122 are provided and reflected light from a plurality of lamps is substantially condensed on the auxiliary ring 31.

According to FIG. 18, the rated ratio of the lamps 411 to 413 and 421 to 423 opposed to the substrate 9 substantially reaches 0 to 25% when power is distributed to the blocks of lamps 411 to 414 and 421 to 424 to approach ideal relative illuminance distribution in the conventional thermal processing apparatus (condition 3), while the rated ratio of the lamps 411 to 413 and 421 to 423 can be set to 50 to 100% in the thermal processing apparatus 1 according to the second preferred embodiment (condition 4). Under the conditions 3 and 4, the rated ratios of the lamps 414 and 424 substantially opposed to the auxiliary rings 31 are assumed to be 100%.

As shown in the curve 1724 (condition 3) in FIG. 16, illuminance for the substrate 9 is reduced to about 40% of ideal illuminance (curve 1721) when approaching the relative illuminance distribution to an ideal state in the conventional thermal processing apparatus. In this case, therefore, it is impossible to properly heat the substrate 9. In the thermal processing apparatus 1 according to the second preferred embodiment, illuminance distribution for the substrate 9 substantially coincides with the ideal illuminance distribution as shown in the curve 1725 (condition 4). Consequently, the RTP for the substrate 9 can be extremely ideally implemented without reducing the yield.

When the rated ratios of power supplied to the plurality of lamps 411 to 414 and 421 to 424 are remarkably different from each other under the condition 3 for the conventional thermal processing apparatus, speeds of response or color temperatures between the lamps 411 to 414 and 421 to 424 or the lives of the lamps 411 to 414 and 421 to 424 disadvantageously differ from each other. Therefore, the thermal processing apparatus 1 according to the second preferred embodiment can also prevent such a problem.

As hereinabove described, the thermal processing apparatus 1 according to the second preferred embodiment can efficiently heat the auxiliary ring 31 by condensing the reflected light from the lamps 411 to 414 and 421 to 424 thereon for improving temperature uniformity of the substrate 9. Further, the thermal processing apparatus 1 provided with the lower reflectors 1122 can obtain proper relative illuminance distribution and proper illuminance distribution on the substrate 9 and prevent the lamps 411 to 414 and 421 to 424 from difference in lit state.

The thermal processing apparatus 1 can also be employed for heating a material (glass substrate or the like) other than a semiconductor substrate, for example.

The lamps 411 to 414 and 421 to 424 of the upper and lower lamp groups 41 and 42 may not be orthogonal to each other but may intersect with each other at a prescribed angle. Further, the auxiliary ring 31 may alternatively be formed by a plurality of members so far as the same encloses the outer periphery of the substrate 9.

While the second preferred embodiment has been described with reference to the thermal processing apparatus 1 having the auxiliary ring 31, the technique of condensing reflected light can also be utilized for a thermal processing apparatus having no auxiliary ring 31. In this case, the reflected light can efficiently be condensed to heat the outer periphery of the substrate 9 for improving temperature uniformity of the substrate 9.

While the thermal processing apparatus 1 rotates the substrate 9, the substrate 9 may be rotated only at need.

The concave surfaces of the upper and lower reflectors 1121 and 1122 may alternatively have parabolic or arcuate sectional shapes, for example, other than elliptic (arcuate) shapes. When symmetry planes of the concave surfaces are inclined toward the substrate 9, the reflected light can be substantially condensed on the outer edges of the auxiliary ring 31 and the substrate 9 for improving temperature uniformity of the substrate 9. Further, the symmetry planes of the concave surfaces corresponding to the lamps 411 to 414 and 421 to 424 on the substrate 9 may be outwardly inclined in order to condense light from a larger number of lamps.

Further, the lower reflectors 1122 may alternatively be provided as a single surface (e.g., two reflectors connected with each other on a position separated from the central axis 1*a*) having two reflecting regions reflecting light from both end regions of the lower lamp group 42.

The substrate 9 may not be horizontally supported, and the overall thermal processing apparatus 1 may be inclined. The overall structure may be vertically inverted so that the lamp groups 41 and 42 are arranged under the substrate 9. Further, combinations of the upper lamp group 41 and the upper reflector 1121 may be vertically provided to be opposed to the upper and lower main surfaces of the substrate 9.

The thermal processing apparatus 1 may individually control lighting of the upper and lower lamp groups 41 and 42 every lamp. When the lamp control part 6 controls power supplied to lamps (may not be all lamps on both ends) present on both end regions in relation to the direction of arrangement of the lower lamp group 42 independently of the lamps present on other regions, the thermal processing apparatus 1 can efficiently heat the auxiliary ring 31 for improving temperature uniformity of the substrate 9.

The thermal processing apparatus 1 may alternatively positively condense reflected light from lamps (e.g., spherical lamps) other than bar lamps, or condense light from a plurality of non-bar lamps on the same region of the auxiliary ring 31 in order to further efficiently heat the auxiliary ring 31.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for irradiating a substrate with light for performing processing accompanied with heating, the apparatus comprising:
   a body part covering said substrate to be processed;
   a first reflecting surface provided at said body part in a position opposed to a main surface of said substrate to be processed;
   a first lamp group including straight-tube lamps arranged along said first reflecting surface to face in a prescribed direction;
   a second lamp group including straight-tube lamps arranged to face in a direction different from said prescribed direction, between said first lamp group and said main surface, said first and second lamp groups being at least partially overlapped; and
   a second reflecting surface provided at said body part, said second reflecting surface reflecting light received from lamps included in said second lamp group, and located on end regions in relation to the direction of arrangement between said first lamp group and said second lamp group.

2. The thermal processing apparatus according to claim 1, further comprising an auxiliary ring outwardly spreading from the outer periphery of said substrate along said outer periphery.

3. The thermal processing apparatus according to claim 1, wherein
   said second reflecting surface reflects light received from a lamp, included in lamps of said second lamp group opposed to the outer periphery of said substrate in relation to a direction perpendicular to said main surface, located most outward or a lamp located outward beyond said lamp.

4. The thermal processing apparatus according to claim 1, further comprising a rotation mechanism rotating said substrate while opposing said substrate to said first reflecting surface.

5. The thermal processing apparatus according to claim 1, further comprising a control part controlling power supplied to said lamps present on said both end regions respectively independently of lamps present in the remaining region.

6. A thermal processing apparatus irradiating a substrate with light for performing processing accompanied with heating, the apparatus comprising:
   a body part covering said substrate to be processed;
   a reflecting surface provided at said body part in a position opposed to a main surface of said substrate to be processed;
   a rotation mechanism rotating said substrate while opposing said substrate to said reflecting surface;
   a lamp group including straight-tube lamps arranged along said reflecting surface; and
   an auxiliary ring outwardly spreading from the outer periphery of said substrate along said outer periphery,
   whereby end regions of said reflecting surface reflect light received from a lamp included in said lamp group and substantially form a ring light condensing region on said auxiliary ring.

7. The thermal processing apparatus according to claim 6, further comprising:
   another lamp group including straight-tube lamps arranged to face in a direction different from said prescribed direction between said lamp group and said main surface, said another lamp group partially crossing said lamp group, and
   a pair of reflecting surfaces provided at said body part, said pair of reflecting surfaces reflecting light from lamps, included in said another lamp group, present on both end regions in relation to the direction of arrangement,
   whereby said reflecting surface reflects light received from lamps, included in said lamp group, present on said both end regions in relation to the direction of arrangement and substantially condenses said light on said auxiliary ring while said pair of reflecting surfaces reflect light from said lamps, included in said another lamp group, present on said both end regions in relation to the direction of arrangement respectively and substantially forms a ring light condensing region on said auxiliary ring.

8. A thermal processing method of irradiating a substrate with light for performing processing accompanied with heating, the method comprising:
   a first irradiation step of irradiating a main surface of said substrate to be processed with light through a first lamp group including straight-tube lamps arranged along a first reflecting surface to face in a prescribed direction, said first reflecting surface being provided at a body part in a position opposed to said main surface;
   a second irradiation step of irradiating said main surface with light through a second lamp group including straight-tube lamps arranged to face in a direction different from said prescribed direction between said first lamp group and said main surface, said second lamp group partially crossing said first lamp group; and
   a reflection step of reflecting light from lamps, included in said second lamp group, present on both end regions in relation to the direction of arrangement by a second reflecting surface provided at said body part and arranged between said first lamp group and said second lamp group.

9. The thermal processing method according to claim 8, further comprising a step of holding said substrate with an auxiliary ring outwardly spreading from the outer periphery of said substrate along said outer periphery.

10. The thermal processing method according to claim 8, wherein
said reflection step reflects light from a lamp, included in those of second lamp group opposed to the outer periphery of said substrate in relation to a direction perpendicular to said main surface, located most outward or a lamp located outward beyond said most outward lamp.

11. The thermal processing method according to claim 8, further comprising a rotation step of rotating said substrate while opposing said substrate to said first reflecting surface.

12. The thermal processing method according to claim 8, further comprising a control step of controlling power supplied to said lamps present on the respective ones of said both end regions independently of lamps present on other regions.

13. A thermal processing method of irradiating a substrate with light for performing processing accompanied with heating, the method comprising:
a first irradiation step of irradiating a main surface of said substrate to be processed with a lamp group including straight-tube lamps arranged along a reflecting surface to face in a prescribed direction, said first reflecting surface being provided at a body part in a position opposed to said main surface;
a step of holding said substrate with an auxiliary ring outwardly spreading from the outer periphery of said substrate along said outer periphery;
a rotation step of rotating said substrate while opposing said substrate to said reflecting surface; and
a first reflection step of reflecting light from a lamp included in said lamp group with end regions of said reflecting surface and substantially forming a ring light condensing region on said auxiliary ring.

14. The thermal processing method according to claim 13, further comprising:
a second irradiation step of irradiating said main surface with light from another lamp group including straight-tube lamps arranged to face in a direction different from said prescribed direction between said lamp group and said main surface, said another lamp group partially crossing said lamp group, and
a second reflection step of reflecting light from lamps, included in said another lamp group including straight-tube lamps, present on both end regions in relation to the direction of arrangement with a pair of reflecting surfaces provided at said body part and arranged between said lamp group and said another lamp group, wherein,
said first reflection step reflects light from lamps, included in said lamp group, present on the respective ones of both end regions in relation to the direction of arrangement with said reflecting surface and substantially condenses said light on said auxiliary ring, and
said second reflection step reflects light from said lamps, included in said another lamp group, present on the respective ones of said both end regions in relation to the direction of arrangement with said pair of reflecting surfaces and substantially forms a ring light condensing region on said auxiliary ring.

15. The thermal processing apparatus according to claim 6, wherein
said reflecting surface has a concave surface, formed along a lamp included in said lamp group, having a symmetry plane inclined from a normal direction of said main surface, said reflecting surface reflects light received from a lamp included in said lamp group and substantially forms a ring light condensing region on said auxiliary ring.

16. The thermal processing apparatus according to claim 15, wherein
said concave surface is formed for each of lamps included in said group, present on both end regions in relation to the direction of arrangement.

17. The thermal processing apparatus according to claim 16, wherein
a plurality of lamps are present on each of said end regions.

18. The thermal processing apparatus according to claim 17, wherein
said reflecting surface condenses light from a plurality of lamps included in said lamp group on the same region.

19. The thermal processing apparatus according to claim 6, further comprising a first control part controlling power supplied to said lamps included in said lamp group, present on said both end regions in relation to the direction of arrangement, said first control part performing power control for said lamps independently of lamps present in the remaining region.

20. The thermal processing apparatus according to claim 7, wherein
said pair of reflecting surfaces have concave surfaces formed along the respective ones of said lamps included in said another lamp group, present on said end regions in relation to the direction of arrangement, and symmetry planes of said concave surfaces are inclined toward said substrate.

21. The thermal processing apparatus according to claim 20, wherein
said concave surface is formed for each of the lamps included in said another lamp group, present on said end regions in relation to the direction of arrangement.

22. The thermal processing apparatus according to claim 21, wherein
a plurality of lamps included in said another lamp group are present on each of said end regions in relation to the direction of arrangement.

23. The thermal processing apparatus according to claim 22, wherein
said pair of reflecting surfaces condense light from said plurality of lamps included in said another lamp group on the same region.

24. The thermal processing apparatus according to claim 7, further comprising a second control part controlling power supplied to said lamps included in said another lamp group, present on said end regions in relation to the direction of arrangement, said second control part performing power control for said lamps independently of lamps present in the remaining region.

25. A thermal processing apparatus irradiating a substrate with light for performing processing accompanied with heating, the apparatus comprising:
a body part covering said substrate to be processed;
a reflecting surface provided at said body part in a position opposed to a main surface of said substrate to be processed;

a rotation mechanism rotating said substrate while opposing said substrate to said reflecting surface; and a lamp group including straight-tube lamps arranged along said reflecting surface;

whereby end regions of said reflecting surface reflect light received from a lamp included in said lamp group and substantially form a ring light condensing region on the outer periphery of said substrate.

26. The thermal processing method according to claim 13, wherein said reflecting surface has a concave surface, formed along a lamp included in said lamp group, having a symmetry plane inclined from the normal direction of said main surface, and said first reflection step reflects light from a lamp included in said lamp group with said reflecting surface and substantially forms a ring light condensing region on said auxiliary ring.

27. The thermal processing apparatus according to claim 26, wherein said reflecting surface has said concave surface for each of lamps included in said lamp group, present on both end regions in relation to the direction of arrangement.

28. The thermal processing apparatus according to claim 27, wherein a plurality of lamps are present on each of said end regions.

29. The thermal processing apparatus according to claim 28, wherein said first reflection step condenses light from said plurality of lamps included in said lamp group on the same region by said reflecting surface.

30. The thermal processing method according to claim 13, further comprising a first control step of controlling power supplied to said lamps included in said lamp group, present on said end regions in relation to the direction of arrangement, said first control step performing power control for said lamps independently of lamps present in the remaining region.

31. The thermal processing method according to claim 14, wherein said pair of reflecting surfaces have concave surfaces formed along the respective ones of said lamps, included in said another lamp group, present on said end regions in relation to the direction of arrangement, and symmetry planes of said concave surfaces are inclined toward said substrate.

32. The thermal processing method according to claim 31, wherein a plurality of lamps included in said another lamp group are present on each of said end regions in relation to the direction of arrangement.

33. The thermal processing method according to claim 32, wherein said concave surface is included in each of lamps included in said another lamp group, present on said end regions in relation to the direction of arrangement.

34. The thermal processing method according to claim 33, wherein said second reflection step condenses light from said plurality of lamps included in said another lamp group on the same region by said pair of reflecting surfaces.

35. The thermal processing method according to claim 14, further comprising a second control step of controlling power supplied to said lamps, included in said another lamp group, present on said end regions in relation to the direction of arrangement, said second control step performing power control for said lamps independently of lamps present in the remaining region.

36. A thermal processing method of irradiating a substrate with light for performing processing accompanied with heating, the method comprising:

a first irradiation step of irradiating a main surface of said substrate to be processed with a lamp group including straight-tube lamps arranged along a reflecting surface to face in a prescribed direction, said reflecting surface being provided at a body part in a position opposed to said main surface;

a rotation step of rotating said substrate while opposing said substrate to said reflecting surface; and a first reflection step of reflecting light from a lamp included in said lamp group with end regions of said reflecting surface and substantially forming a ring light condensing region on the outer periphery of said substrate.

* * * * *